United States Patent
Liao et al.

(10) Patent No.: US 9,153,747 B2
(45) Date of Patent: Oct. 6, 2015

(54) LIGHT-EMITTING ELEMENT

(71) Applicant: Epistar Corporation, Hsinchu (TW)

(72) Inventors: Wen-Luh Liao, Hsinchu (TW); Chien-Chung Hsu, Hsinchu (TW); Yao-Ru Chang, Hsinchu (TW); Shih-I Chen, Hsinchu (TW); Chia-Liang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/302,036

(22) Filed: Jun. 11, 2014

(65) Prior Publication Data
US 2015/0014721 A1   Jan. 15, 2015

(30) Foreign Application Priority Data
Jul. 10, 2013 (TW) .............................. 102124862 A

(51) Int. Cl.
*H01L 33/46* (2010.01)
*H01L 33/38* (2010.01)
*H01L 33/42* (2010.01)

(52) U.S. Cl.
CPC ................ *H01L 33/46* (2013.01); *H01L 33/38* (2013.01); *H01L 33/42* (2013.01)

(58) Field of Classification Search
CPC ......... H01L 33/20; H01L 33/60; H01L 33/54; H01L 33/62; H01L 33/58
USPC ...................... 257/79, 84, 88, 81, 98, 99, 100
See application file for complete search history.

(56) References Cited

U.S. PATENT DOCUMENTS 7,119,372 B2 * 10/2006 Stokes et al. .................... 257/79
7,906,795 B2    3/2011 Huang et al.

* cited by examiner

*Primary Examiner* — Hoa B Trinh
(74) *Attorney, Agent, or Firm* — Ditthavong & Steiner, P.C.

(57) ABSTRACT

A light-emitting element includes a light-emitting stack which has an active layer, and a non-oxide insulative layer below the light-emitting stack, wherein a refractive index of the non-oxide insulative layer is less than 1.4.

20 Claims, 4 Drawing Sheets

LIGHT-EMITTING ELEMENT

TECHNICAL FIELD

The disclosure is related to a light-emitting element, and more particularly, a light-emitting element with high reflectivity.

REFERENCE TO RELATED APPLICATION

This application claims the right of priority based on TW application Serial No. 102124862, filed on Jul. 10, 2013, and the content of which is hereby incorporated by reference in its entirety.

DESCRIPTION OF THE RELATED ART

Optical element such as LEDs are widely adopted in optical display devices, traffic lights, information storage apparatuses, communication apparatuses, lighting apparatuses, and medical appliances. The abovementioned LEDs can further connect to other devices for forming a light-emitting device. FIG. 1 illustrates a schematic structure of a light-emitting device. As shown in FIG. 1, a light-emitting device 1 includes a sub-carrier 12 having a circuit 14, a soldering material 16 on the sub-carrier 12 for mounting the LED 11 on the sub-carrier 12 and electrically connecting the LED 11 with the circuit 14 of the sub-carrier 12, and an electrical connecting structure 18 for electrically connecting with an electrode 15 of the LED 11 and the circuit 14 of the sub-carrier 12. The abovementioned sub-carrier 12 can be a lead frame or mounting substrate with a large size.

SUMMARY OF THE DISCLOSURE

A light-emitting element includes a light-emitting stack having an active layer, and a non-oxide insulative layer below the light-emitting stack, wherein a refractive index of the non-oxide insulative layer is less than 1.4.

BRIEF DESCRIPTION OF THE DRAWING

The accompanying drawing is included to provide easy understanding of the application, and is incorporated herein and constitutes a part of this specification. The drawing illustrates the embodiment of the application and, together with the description, serves to illustrate the principles of the application.

DETAILED DESCRIPTION OF THE EMBODIMENTS

Figure 1:
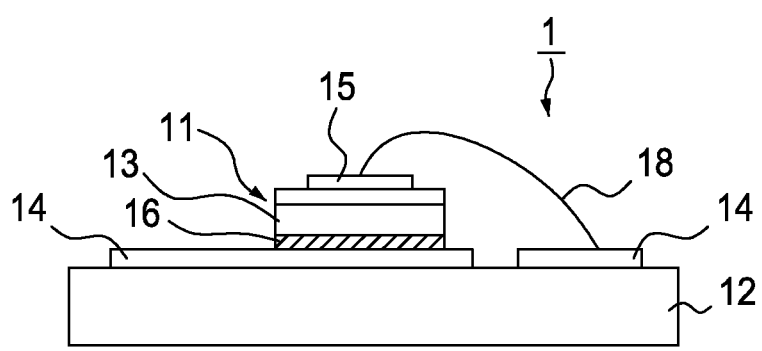
FIG. 1 illustrates a schematic structure of a conventional light-emitting device.

To better and concisely explain the application, the same name or the same reference number given or appeared in different paragraphs or figures along the specification should has the same or equivalent meanings while it is once defined anywhere of the application.

The following shows the description of embodiments of the application in accordance with the drawing.

Figure 2A:
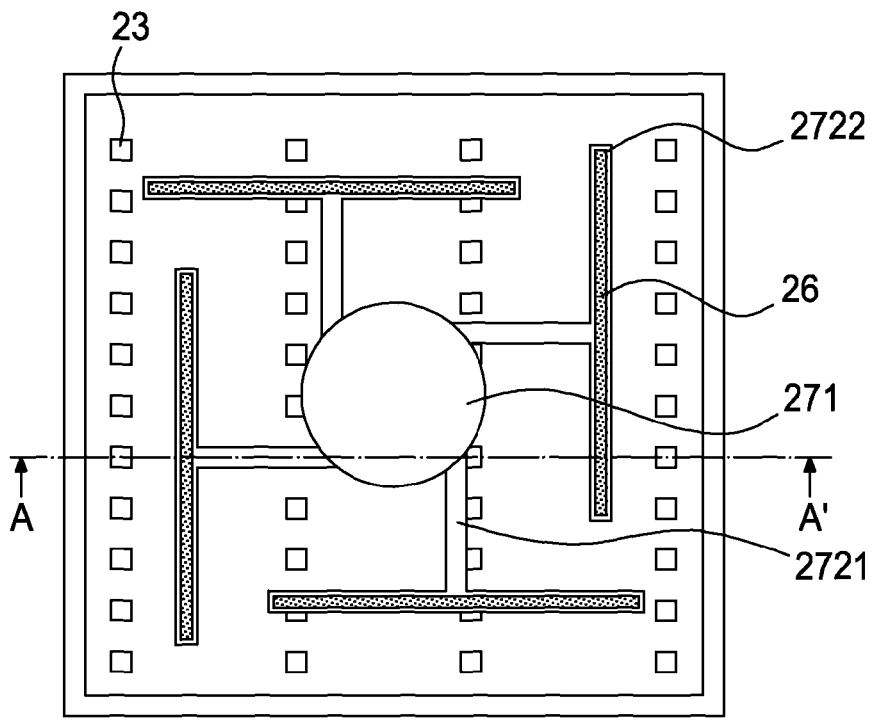
FIG. 2A illustrates a top view of a light-emitting element in accordance with an embodiment of the application.
Figure 2B:
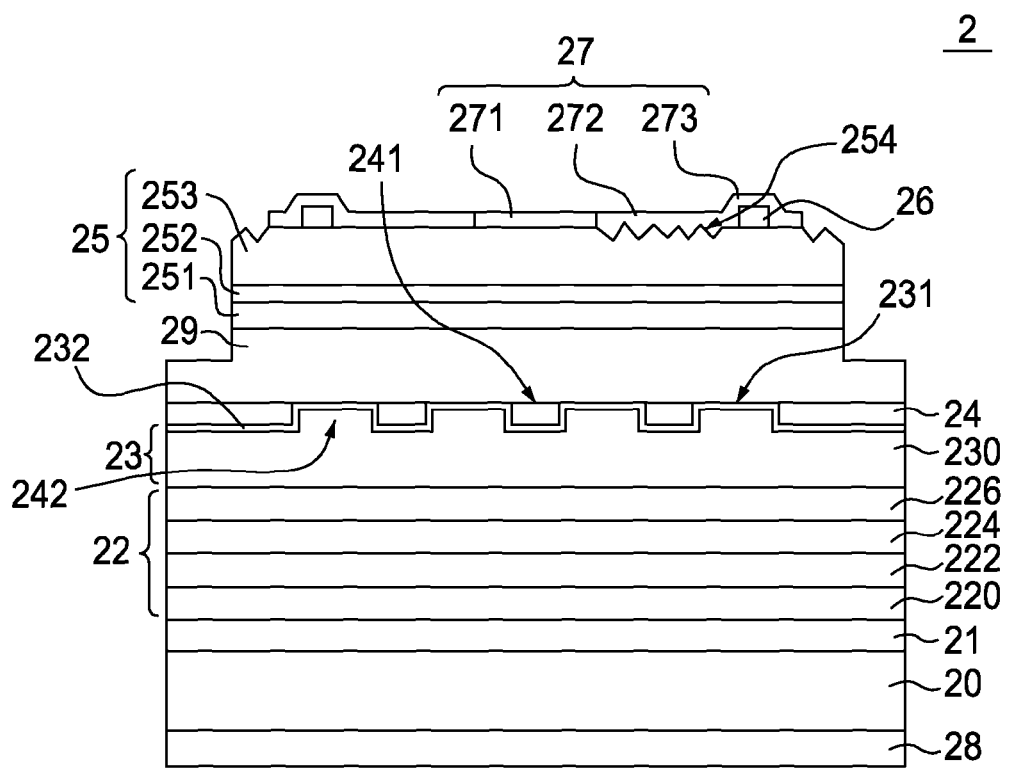
FIG. 2B illustrates a cross section of FIG. 2A along a profile line AA'.

FIG. 2A illustrates a top view of a light-emitting element in accordance with an embodiment of the application. FIG. 2B illustrates a cross section of FIG. 2A along a profile line AA'. As shown in FIG. 2B, a light-emitting element 2 includes a substrate 20, a conducting adhesive layer 21 on the substrate 20, a reflection structure 22 on the conducting adhesive layer 20, a transparent conducting structure 23 on the reflection structure 22, a window layer 29 on the transparent conducting structure 23, a non-oxide insulative layer 24 between the transparent conducting structure 23 and the window layer 29, a light-emitting stack 25 on the window layer 29, an electrical contact layer 26 on the light-emitting stack 25, a first electrode 27 on the light-emitting stack 25 and the electrical contact layer 26, and a second electrode 28 below the substrate 20, wherein the light-emitting stack 25 includes a first semiconductor layer 251 between the window layer 29 and the first electrode 27, an active 252 between the first semiconductor layer 251 and the first electrode 27, and a second semiconductor layer 253 between the active layer 252 and the first electrode 27.

The first electrode 27 and/or the second electrode 28 are for an external voltage and made of a transparent conducting material or a metal material. The transparent conducting material includes, but is not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), aluminum gallium arsenide (AlGaAs), gallium nitride (GaN), gallium phosphide (GaP), gallium arsenide (GaAs), gallium arsenide phosphide (GaAsP), indium zinc oxide (IZO), or diamond like carbon (DLC). The metal material includes, but is not limited to aluminum (Al), chromium (Cr), copper (Cu), tin (Sn), gold (Au), nickel (Ni), titanium (Ti), platinum (Pt), lead (Pb), zinc (Zn), cadmium (Cd), antimony (Sb), cobalt (Co), or an alloy including the abovementioned. The first electrode 27 includes a current input portion 271 and an extension portion 272. As shown in FIG. 2A, the current input portion 271 is substantially on a center of the second semiconductor layer 253, the extension portion 272 includes a first branch 2721 extends from the current input portion 271 to a boundary of the light-emitting element 2, and a second branch 2722 extends from the first branch 2721 for improving current diffusion. As shown in FIG. 2B, the extension portion 272 includes a protrusive portion 273 on the electrical contact layer 26, covering at least one surface of the electrical contact layer 26 for increasing ohmic contact area with the electrical contact layer 26 and lowing resistance of the light-emitting element 2, wherein the protrusive portion 273 higher than the current input portion 271.

The electrical contact layer 26 is between the second branch 2722 and the light-emitting stack 25 for forming an ohmic contact between the second branch 2722 and the light-emitting stack 25. A resistance between the electrical contact layer 26 and the second branch 2722 and a resistance between the electrical contact layer 26 and the light-emitting stack 25 are less than a resistance between the first electrode 27 and the light-emitting stack 25. A material of the electrical contact layer 26 can be a semiconductor material including at least one element, like gallium (Ga), aluminum (Al), indium (In), phosphorus (P), nitrogen (N), zinc (Zn), cadmium (Cd), or selenium (Se). A polarity of the electrical contact layer 26 can be the same as the polarity of the second semiconductor layer 253.

A material of the light-emitting stack 25 can be a semiconductor material, including more than one element like gallium (Ga), aluminum (Al), indium (In), phosphorus (P), nitrogen (N), zinc (Zn), cadmium (Cd), or selenium (Se). The polarities of the first semiconductor 251 and the second semiconductor layer 253 are different for generating electrons or holes. A light-exiting upper surface 254 of the second semiconductor layer 253 can be a rough surface for reducing total internal reflection, so as to increase luminous efficiency of the light-emitting element 2. The active layer 252 can emit one or more kinds of color lights which are visible or invisible and can be a single-heterostructure, a double-heterostructure, a double side double-heterostructure, multi-quantum wells structure, or quantum dots. The polarity of the window layer 29 can be the same as the polarity of the first semiconductor layer 251 for serving as a light extraction layer to increase luminous efficiency of the light-emitting element 2. The window layer 29 with respect to light emitted from the active layer 252 is transparent. Additionally, a material of the window layer 29 can be a transparent conducting material including but is not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), magnesium oxide (MgO), aluminum gallium arsenide (AlGaAs), gallium nitride (GaN), gallium phosphide (GaP), or indium zinc oxide (IZO).

The transparent conducting structure 23 with respect to light emitted from the light-emitting stack 25 is transparent and can improve the ohmic contact between the window layer 251 and the reflection structure 22, the current conduction, and the current diffusion. Additionally, the transparent conducting structure 23 and the reflection structure 22 can form an omni-directional reflector (ODR) which is made of a transparent material including but is not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), gallium phosphide (GaP), indium cerium oxide (ICO), indium tungsten oxide (IWO), indium titanium oxide (ITiO), indium zinc oxide (IZO), indium gallium oxide (IGO), gallium aluminum zinc oxide (GAZO), or a combination thereof. The transparent conducting structure 23 includes a first conducting oxide layer 230 below the non-oxide insulative layer 24 and a second conducting oxide layer 232 between the light-emitting stack 25 and the first conducting oxide layer 230. The materials of the first conducting oxide layer 230 and the second conducting oxide layer 232 are different. In another embodiment, the first conducting oxide layer 230 has at least one different element in comparison with the composition of the material of the second conducting oxide layer 232. For example, the material of the first conducting oxide layer 230 is indium zinc oxide (IZO) and the material of the second conducting oxide layer 232 is indium tin oxide (ITO). The second conducting oxide layer 232 can directly contact with the non-oxide insulative layer 24 and/or the window layer 29 and cover at least one surface of the non-oxide insulative layer 24.

Figure 3:
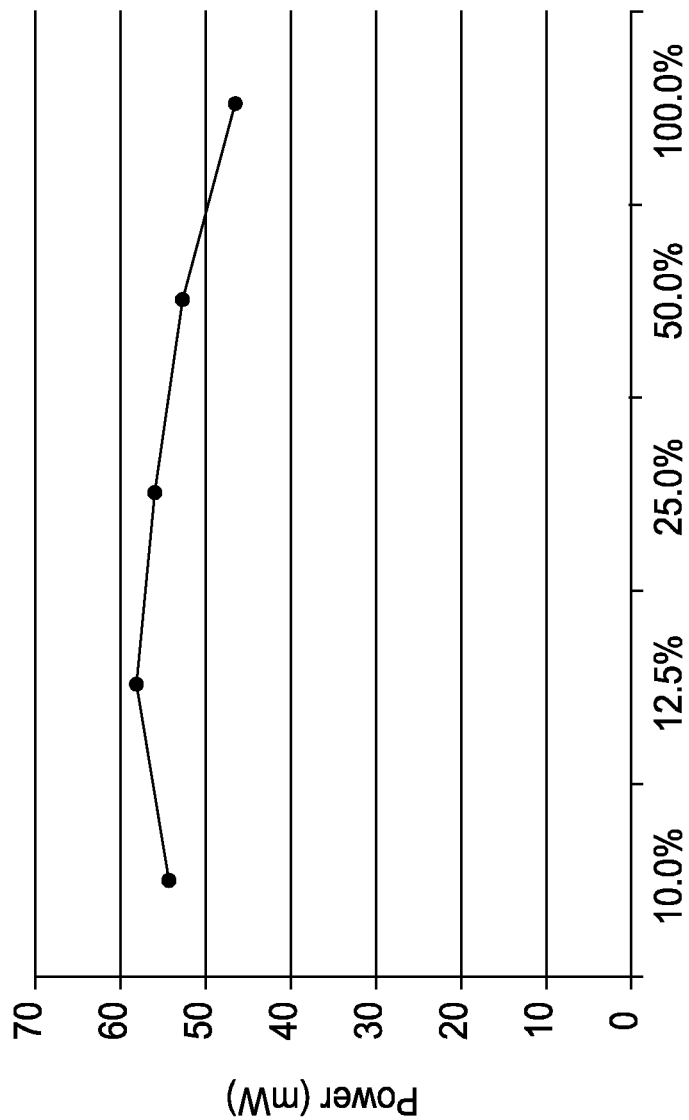
FIG. 3 illustrates the percentage of the surface area of the first contact upper surface to a sum of surface areas of the first contact upper surface and the second contact upper surface versus power.

The transmittance of the non-oxide insulative layer 24 to the light emitted from the light-emitting stack 25 is greater than 90% and the refractive index of the non-oxide insulative layer 24 is less than 1.4, which is better between 1.3~1.4. A material of the non-oxide insulative layer 24 can be a non-oxide insulative material, for example, benzocyclobutene (BCB), cyclic olefin copolymers (COC), fluorocarbon polymer, silicon nitride ($SiN_x$). In another embodiment, a material of the non-oxide insulative layer 24 can include a halide, a group IIA combination, or a group VIIA combination, for example, calcium difluoride ($CaF_2$) or magnesium difluoride ($MgF_2$), and a refractive index of the non-oxide insulative layer 24 is less than refractive indexes of the window layer 29 and the transparent conducting structure 23. Since the refractive index of the non-oxide insulative layer 24 is less than the refractive indexes of the window layer 29 and the transparent conducting structure 23, and a critical angle of an interface between the window layer 29 and the non-oxide insulative layer 24 is less than a critical angle of an interface between the window layer 29 and the transparent conducting structure 23, the probability of total internal reflection that occurs when the light emitted from the light-emitting stack 25 passes through an interface between the light-emitting stack 25 and the non-oxide insulative layer 24 is increased accordingly. Additionally, the light that does not encounter total internal reflection at the interface between the window layer 29 and the transparent conducting structure 23 encounters totally internal reflection at the interface between the transparent conducting structure 23 and the non-oxide insulative layer 24 so the light extraction efficiency of the light-emitting element 2 is increased. The transparent conducting structure 23 has a first contact upper surface 231 contacting the window layer 29, and the non-oxide insulative layer 24 has a second contact upper surface 241 contacting the window layer 29. The first contact upper surface 231 and the second contact upper surface 241 are at the same level substantially, namely, a distance between the first contact upper surface 231 and the light-exiting upper surface 254 is substantially equal to a distance between the second contact upper surface 241 and the light-exiting upper surface 254. FIG. 3 illustrates the percentage of the surface area of the first contact upper surface to a sum of surface areas of the first contact upper surface and the second contact upper surface (hereafter, surface percentage) versus power of the light-emitting element 2. As shown in FIG. 3, when the surface area of the first contact upper surface 231 is about 10%~50% of a sum of the surface areas of the first contact upper surface 231 and the second contact upper surface 241, the power of the light-emitting element 2 is greater than 50 mW, which is better than that of a light-emitting element with a surface percentage greater than 50%. In a preferred embodiment, the surface percentage of the light-emitting element 2 is 12.5~25%, and in such case, power of the light-emitting element 2 can be greater than 55 mW. In other words, when a ratio of a surface area of the non-oxide insulative layer 24 to a surface area of the window layer 29 is about 0.5~0.9, the light-emitting element 2 has better power performance. In another embodiment, the second contact upper surface 241 can be a rough surface to scatter the light from the light-emitting stack 25 for increasing luminous efficiency of the light-emitting element 2. The non-oxide insulative layer 24 can be disposed as a pattern, for example, a pattern right under the electrical contact layer 26 and/or the current input portion 271 for diffusing a current. In another embodiment, the non-oxide insulative layer 24 can have random pattern or is not located right under the electrical contact layer 26 and/or the current input portion 271. A thickness of the non-oxide insulative layer 24 is less than a half of a thickness of the transparent conducting structure 23. In yet another embodiment, a thickness of the non-oxide insulative layer 24 is less than 1/5 of a thickness of the transparent conducting structure 23 to prevent a planarization process for the transparent conducting structure 23 from damaging the non-oxide insulative layer 24. At least one surface of the non-oxide insulative layer 24 is covered by the transparent conducting structure 23 for strongly joining the transparent conducting structure 23 to the window layer 29 so as to enhance mechanical strength. In another embodiment, the non-oxide insulative layer 24 can directly join the reflection structure 22 for preventing the transparent conducting structure 23 and the reflection structure 22 from peeling because of insufficient adhesion force. Additionally, the non-oxide insulative layer 24 further includes a plurality of pores 242 penetrating the non-oxide insulative layer 24 and the transparent conducting structure 23 fills the plurality of pores 242 for forming an ohmic contact.

The reflection structure 22 can reflect light emitted from the light-emitting stack 25, and the material of the reflection structure 22 can be metal material including, but not limited to copper (Cu), aluminum (Al), tin (Sn), gold (Au), silver (Ag), lead (Pb), titanium (Ti), nickel (Ni), platinum (Pt), tungsten (W) or an alloy made of the above mentioned. The reflection structure 22 includes a reflection layer 226, a reflective adhesion layer 224 below the reflection layer 226, a barrier layer 222 below the reflective adhesion layer 224, and an ohmic contact layer 220 below the barrier layer 222. The reflection layer 226 can reflect light emitted from the light-emitting stack 25, the reflective adhesion layer 224 adheres to the reflection layer 226 and the barrier 222, and the barrier layer 222 can prevent the material of the reflection layer 226 from diffusing to the ohmic contact layer 220 and damaging the reflection layer 226 so as to reduce the reflection efficiency of the reflection layer 226. The ohmic contact layer 220 has ohmic contacts with the conducting adhesive layer 21. The conducting adhesive layer 21 connects to the substrate 20 and the reflection structure 22 and includes a plurality of sublayers (not shown in figures) and can be a transparent conducting material or a metal material. The transparent conducting material includes, but is not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), gallium phosphide (GaP), indium cerium oxide (ICO), indium tungsten oxide (IWO), indium titanium oxide (ITiO), indium zinc oxide (IZO), indium gallium oxide (IGO), gallium aluminum zinc oxide (GAZO), or a combination thereof. The metal material includes, but is not limited to copper (Cu), aluminum (Al), tin (Sn), gold (Au), silver (Ag), lead (Pb), titanium (Ti), nickel (Ni), platinum (Pt), tungsten (W), or an alloy made of the above mentioned.

The substrate 20 can support the light-emitting stack 25 and other layers or structures and be made of a transparent material or a conducting material. For example, the transparent material can include, but not limited to sapphire, diamond, glass, epoxy, quartz, acryl, $Al_2O_3$, zinc oxide (ZnO), or aluminum nitride (AlN); the conducting material can include, but be not limited to copper (Cu), aluminum (Al), molybdenum (Mo), tin (Sn), zinc (Zn), cadmium (Cd), nickel (Ni), cobalt (Co), diamond like carbon (DLC), graphite, carbon fiber, metal matrix composite (MMC), ceramic matrix composite (CMC), silicon (Si), zinc selenide (ZnSe), gallium arsenide (GaAs), silicon carbide (SiC), gallium phosphide (GaP), gallium arsenide phosphide (GaAsP), indium phosphide (InP), $LiGaO_2$, or $LiAlO_2$.

Figure 4:
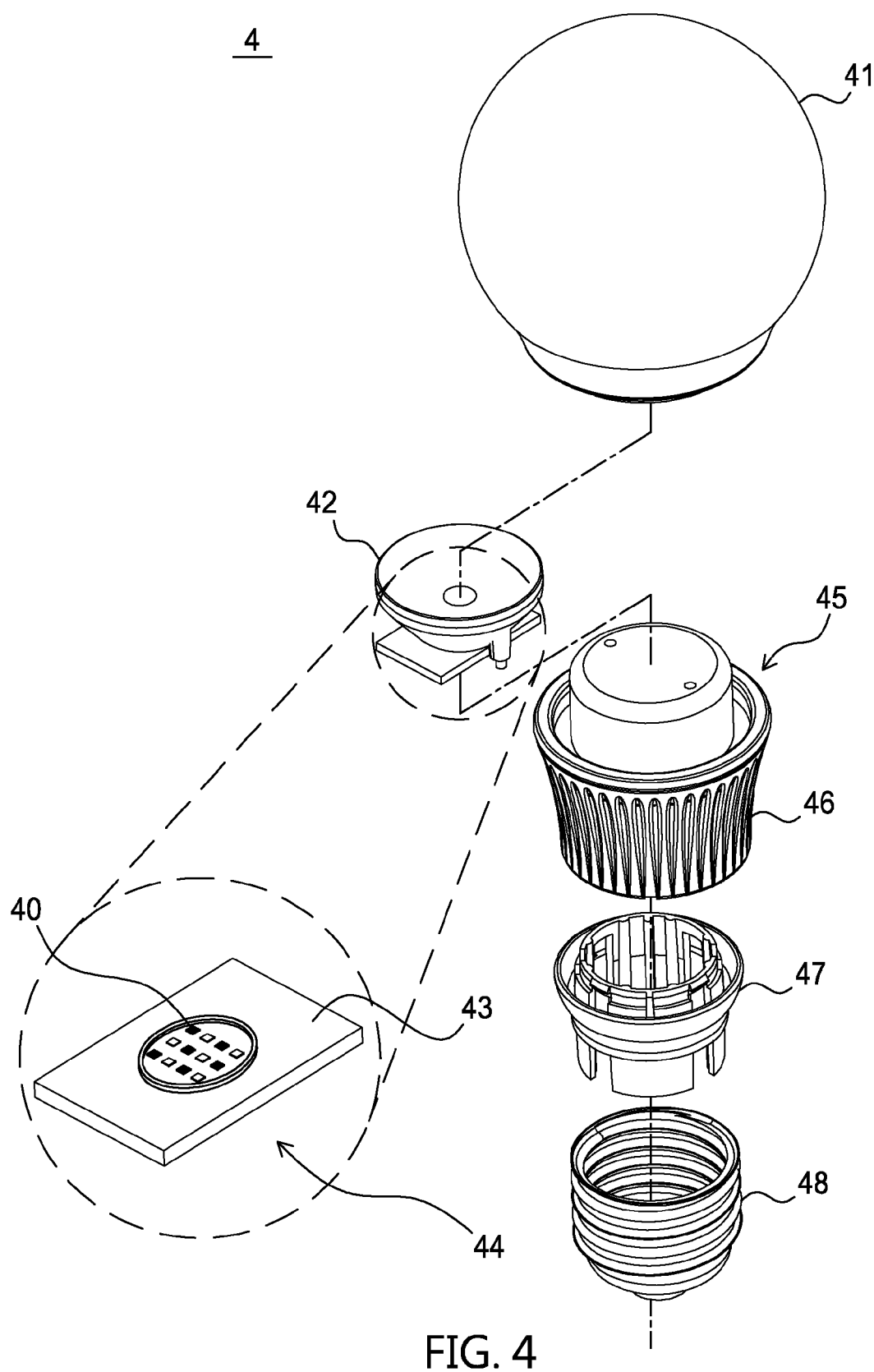
FIG. 4 illustrates an exploded view of a lamp in accordance with an embodiment of the application.

FIG. 4 illustrates an explored view of a lamp. A lamp 4 includes a lamp cover 41, a lens 42 in the lamp cover 41, a light-emitting module 44 under the lens 42, a base 45 having a heat sink 46 for carrying the light-emitting module 44, a connection portion 47, and an electrical connector 48, wherein the connection portion 47 connects to the base 45 and the electrical connector 48, and the light-emitting module 44 has a carrier 43 and a plurality of the light-emitting elements 40 of any of the abovementioned embodiments on the carrier 43.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting element, comprising:
   a light-emitting stack comprising an active layer; and
   a non-oxide insulative layer connecting to the light-emitting stack;
   wherein a refractive index of the non-oxide insulative layer is less than 1.4; and
   wherein a material of the non-oxide insulative layer comprises a halide, a group IIA compound, or a group VIIA compound.

2. The light-emitting element of claim 1, further comprising a window layer between the active layer and the non-oxide insulative layer, wherein a refractive index of the window layer is greater than a refractive index of the non-oxide insulative layer.

3. The light-emitting element of claim 1, further comprising an electrical contact layer on the non-oxide insulative layer.

4. The light-emitting element of claim 3, wherein the electrical contact layer comprises a semiconductor material.

5. The light-emitting element of claim 3, further comprising a first electrode on the light-emitting stack.

6. The light-emitting element of claim 5, wherein the first electrode comprises a protrusive portion on the electrical contact layer and/or the first electrode comprises an extension portion covering the electrical contact layer.

7. The light-emitting element of claim 1, wherein a refractive index of the non-oxide insulative layer is 1.3~1.4.

8. The light-emitting element of claim 1, further comprising a reflection layer below the non-oxide insulative layer.

9. The light-emitting element of claim 8, wherein the non-oxide insulative layer directly connects to the reflection layer.

10. The light-emitting element of claim 8, further comprising:
    a reflection adhesive layer below the reflection layer;
    a barrier layer below the reflection adhesive layer; and
    an ohmic contact layer below the barrier layer.

11. The light-emitting element of claim 1, further comprising a transparent conducting structure covering a surface of the non-oxide insulative layer.

12. The light-emitting element of claim 11, wherein the transparent conducting structure comprises a first contact upper surface contacting the light-emitting stack, the non-oxide insulative layer comprises a second contact upper surface contacting the light-emitting stack, and a surface area of the first contact upper surface is about 10%-50% of a sum of surface areas of the first contact upper surface and the second contact upper surface.

13. The light-emitting element of claim 11, further comprising a plurality of pores penetrating the non-oxide insulative layer, wherein the transparent conducting structure fills the plurality of pores.

14. The light-emitting element of claim 11, wherein a thickness of the non-oxide insulative layer is less than a half of a thickness of the transparent conducting structure or a thickness of the non-oxide insulative layer is less than ⅕ of a thickness of the transparent conducting structure.

15. The light-emitting element of claim 11, wherein the light-emitting element further comprises:
- a first conducting oxide layer below the non-oxide insulative layer; and
- a second conducting oxide layer between the light-emitting stack and the first conducting oxide layer.

16. The light-emitting element of claim 15, wherein the first conducting oxide layer has at least one different element in comparison with a composition of a material of the second conducting oxide layer.

17. The light-emitting element of claim 1, further comprising:
- a substrate below the non-oxide insulative layer; and
- a conducting adhesive layer between the substrate and the non-oxide insulative layer.

18. The light-emitting element of claim 1, a ratio of a surface area of the non-oxide insulative layer to a surface area of the window layer is 0.5~0.9%.

19. A light-emitting element, comprising:
- a light-emitting stack comprising an active layer; and
- a non-oxide insulative layer connecting to the light-emitting stack; and
- a transparent conducting structure covering a surface of the non-oxide insulative layer; and
- a plurality of pores penetrating the non-oxide insulative layer,
- wherein the transparent conducting structure fills the plurality of pores, and
- wherein a refractive index of the non-oxide insulative layer is less than 1.4.

20. A light-emitting element, comprising:
- a light-emitting stack comprising an active layer;
- a non-oxide insulative layer connecting to the light-emitting stack;
- a window layer between the non-oxide insulative layer and the light-emitting stack; and
- a transparent conducting structure below the window layer and the non-oxide insulative layer;
- wherein a critical angle of an interface between the window layer and the non-oxide insulative layer is less than a critical angle of an interface between the window layer and the transparent conducting structure, and
- wherein a refractive index of the non-oxide insulative layer is less than 1.4.

* * * * *